United States Patent [19]

Tsukada et al.

[11] Patent Number: 5,043,956

[45] Date of Patent: Aug. 27, 1991

[54] WRISTWATCH WITH OSCILLATION ALARM

[75] Inventors: Nobuo Tsukada; Kou Yamazaki; Keishi Honmura, all of Tokyo, Japan

[73] Assignee: Seiko Instruments Inc., Japan

[21] Appl. No.: 539,724

[22] Filed: Jun. 15, 1990

[30] Foreign Application Priority Data

| | | | |
|---|---|---|---|
| Jun. 26, 1989 | [JP] | Japan | 1-74576[U] |
| Jan. 24, 1990 | [JP] | Japan | 2-5754[U] |
| Feb. 13, 1990 | [JP] | Japan | 2-13030[U] |
| Feb. 16, 1990 | [JP] | Japan | 2-15113[U] |

[51] Int. Cl.[5] ........ G04C 21/16; H01L 41/08

[52] U.S. Cl. ........ 368/255; 310/323

[58] Field of Search ........ 368/10, 72-74, 368/250, 251, 255; 310/316, 323

[56] References Cited

U.S. PATENT DOCUMENTS

| | | | |
|---|---|---|---|
| 4,192,035 | 3/1980 | Kuris | 318/116 |
| 4,525,075 | 6/1985 | Kita | 368/10 |
| 4,703,213 | 10/1987 | Gasler | 310/316 |
| 4,739,212 | 4/1988 | Imasaka et al. | 310/323 |
| 4,833,359 | 5/1989 | Tanoue et al. | 310/316 |
| 4,848,446 | 9/1989 | Kumada | 310/323 |

*Primary Examiner*—Vit W. Miska

*Attorney, Agent, or Firm*—Bruce L. Adams; Van C. Wilks

[57] ABSTRACT

A wristwatch with an oscillation alarm uses an ultrasonic motor as its drive source. A vibration member has a piezoelectric element adhered thereto on one side and comb-like projections on the other side. A rotor has a sliding member composed of resin at its contacting portion with the comb-like projections and an eccentric weight at its outer circumferential portion. Shock absorbers are sandwiched between the weight and the rotor to absorb shocks applied to the rotor and thus prevent rotor damage. In the vicinity of the upper or lower side of the weight, there is disposed an abutment portion made of rigid material, the abutment portion abutting with the weight when shocks of large magnitude are applied to the rotor to assist the shock absorbers in preventing damage to the rotor.

20 Claims, 11 Drawing Sheets

WRISTWATCH WITH OSCILLATION ALARM

BACKGROUND OF THE INVENTION

The present device relates to a wristwatch with an oscillation alarm.

In recent years, there has been developed and practiced in many field an ultrasonic motor which has its rotor rotated by a traveling-wave generated by making use of the extensions and contractions of a piezoelectric element. This ultrasonic motor needs no reduction gear train or the like partly because it is simply constructed by stacking planar parts and partly because it has the characteristics of low speed rotation and a high torque. Thus, the ultrasonic motor is advantageous in that a high torque can be obtained by a thin, compact and simple structure, so that its application to the field of a wristwatch is expected.

In the wristwatch, the alarm function is highly practical. Since, however, the alarming function of the prior art to generate a warning sound is sometimes annoying, it is desired to realize a soundless alarm watch. It is, therefore, conceivable to provide an oscillation alarm which is enabled to inform the time by positioning a weight at the outer circumference of the rotor of the aforementioned ultrasonic motor to have its center of gravity offset from the center of rotation and by rotating the rotor to generate oscillations due to the shift of the center of gravity. Although a specific structure relating to such oscillation alarm is not disclosed yet, an example is presented in FIG. 21. A vibration member 1 has a piezoelectric element 2 adhered thereto and has its opposite side formed with a comb-like projections 1. A rotor 3 has a sliding member 3*a* adhered to its contacting portion with the vibration member 1 and is integrally formed with a semicircular ridge 3*b* at its outer circumferential portion to offset the center of gravity from the center of rotations. When the rotor 3 is rotated, the eccentric center of gravity is moved to oscillate the whole structure including a plate 8.

When an impact such as a fall is applied to a wristwatch having an oscillation alarm and the structure shown in FIG. 21, a very strong force is applied to the ridge 3*b* of the rotor 3. In case the wristwatch is dropped from a height of 1 [m], an acceleration at the level of 10,000 to 20,000 G is established, as is well known in the art. Even if the weight of the rotor 3 is as small as 1 [g], for example, the force due to the impact is 10 to 20 [kg]. In case this impact is received, it is wholly borne by the vibration member 1 through the contacting portion between the sliding member 3*a* and the comb-like projections 1*a*. Here, the comb-like projections 1*a* are generally composed of a repetition of undulations which are made of a highly rigid metal so as to enhance the rotating performance. The sliding member 3*a* is also made of a resin or the like so as to enhance the rotating performance. When, therefore, an excessive force is applied to that contacting portion, a pressure flaw following the shape of the comb-like projections 1*a* is formed on the sliding member 3*a*. If this pressure flaw is formed, it establishes a cause for resistance against the rotation of the rotor, thus raising a problem of significantly lowering the rotating performance or making the rotation impossible.

On the other hand, in the oscillation motor structure of an electronic wristwatch with a soundless alarm, a large gap is formed by the holding member and by the rotor, the weight and the vibration member to allow invasion of impurities such as dust, as shown in FIG. 21. Thus, the oscillation motor structure has a drawback that the oscillation motor is liable to stop or operate with an inferior reliability.

SUMMARY OF THE INVENTION

It is, therefore, one object of the present invention to solve such problems and to provide a structure of an oscillation alarm which keeps the sliding member of the rotor free from any pressure flaw even when an impact, such as a fall, is experienced.

Another object of the present invention is to improve the reliability of the oscillation motor either by enlarging the shock absorber, which is sandwiched between the rotor and the weight and made of rubber or a synthetic resin to cover the gap which is defined by the rotor, the weight and the vibration member and the plate or by providing a dust-proof member.

According to the present invention the eccentric weight portion of the rotor is made separate, and a shock absorber made of rubber or the like is sandwiched between the two members. At the opposite side, there is disposed across a shock absorber of rubber or the like a weight holder which is integrally united with the rotor. Moreover, the weight is underlaid through a suitable clearance by an abutment portion made of a rigid material.

Moreover, the weight is shaped to have a thickness effective to leave a clearance from the upper face of the vibration member base between the outside of the comb-like projections and the diametrically outside of the vibration member and a thickness to protrude from the lower face of the vibration member at the outside of the vibration member to form a clearance from the plate.

In a movement having the oscillation alarm having the structure thus far described, the weight moves while compressing and deforming the shock absorbers, in case an impact such as a fall is received, until it comes into abutment with the abutment portion to recive the impact wholly. Since a small force for deforming the shock absorbers is applied to the contacting portion between the sliding member and the comb-like projections, no pressure flaw of the comb-like projections is left in the sliding member so that the rotating performance of the motor is not adversely affected in the least.

Under the condition in which only the weight is moved to abut against another rigid portion so that it can receive the impact, the eccentricity (i.e., the primary moment) of the weight becomes the maximum so that the oscillations are felt the most, in case the weight is protruded downward from the vibration member base at its diametrical outside of the vibration member to abut against the plate.

To improve the reliability of the oscillation motor from invasion of dust, according to the present invention, there is provided a structure which is equipped with either a shock absorber formed to cover the plate, the rotor, the weight and the vibration member or a dust-proof member.

Accordingly, the invasion of dust can be prevented to supply a highly reliable electronic wristwatch with a soundless alarm.

BRIEF DESCRIPTION OF THE DRAWINGS

FIG. 3(*b*) is a sectional view of a vibration member;

DETAILED DESCRIPTION OF THE PREFERRED EMBODIMENTS

Figure 1:
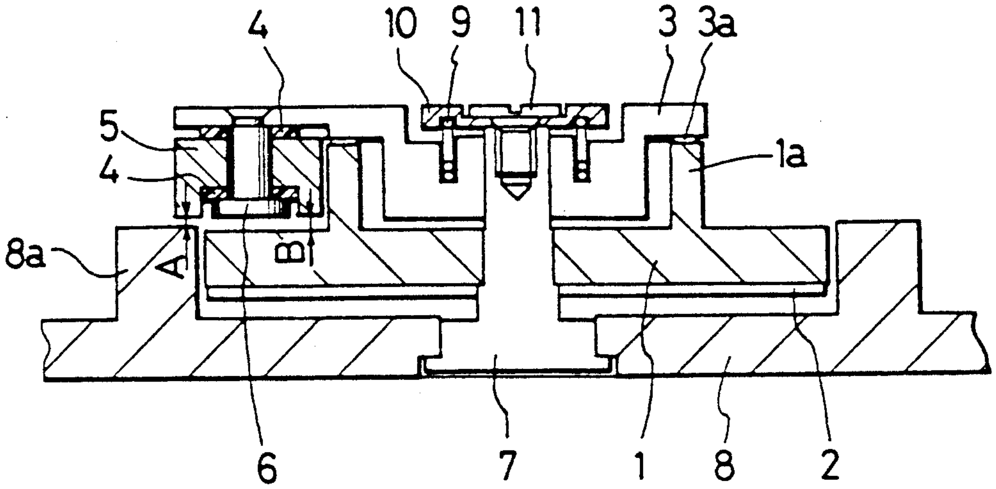
FIG. 1 is a sectional view of a first embodiment of the present invention.
Figure 2:
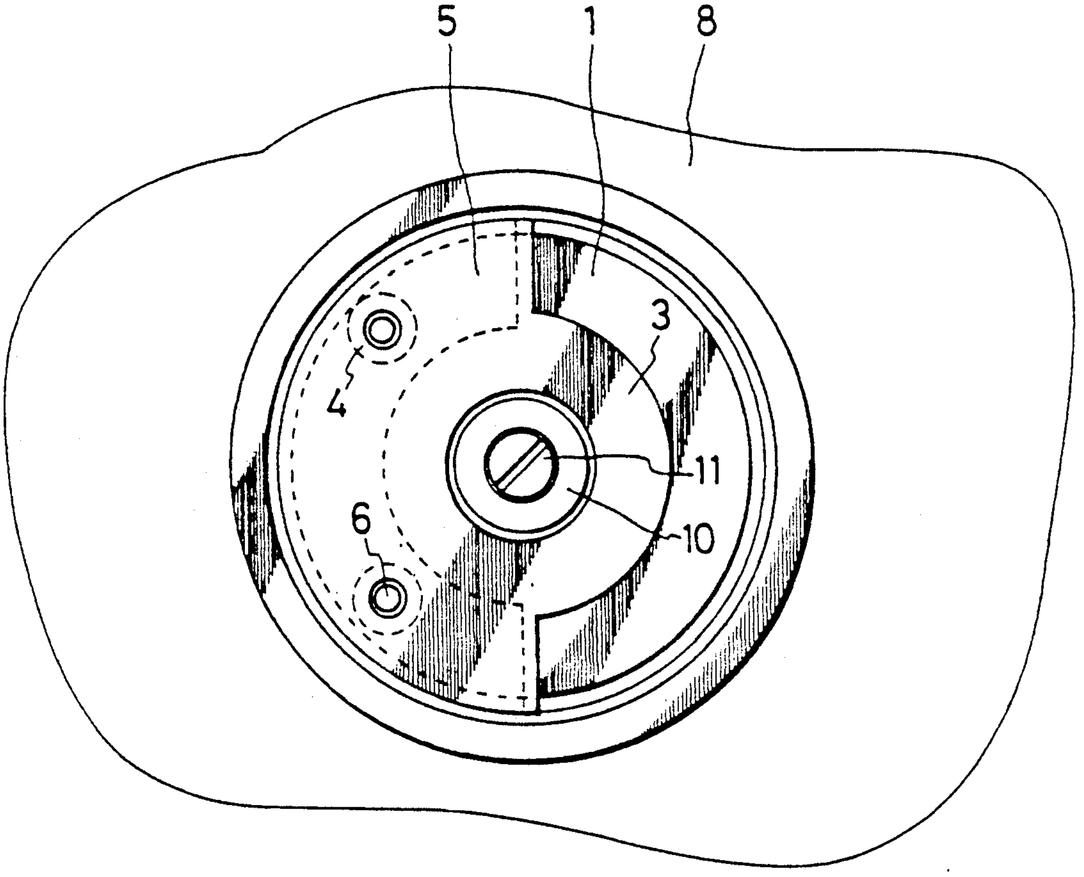
FIG. 2 is a plane view of the first embodiment of the present invention.

The present invention will be described in the following in connection with the embodiments thereof with reference to the accompanying drawings. In FIG. 1 and FIG. 2, a vibration member 1 has a piezoelectric element 2 adhered thereto on one side and is formed with comb-like projections 1*a* at its other side. A rotor 3 has a sliding member 3*a* adhered thereto at its contacting portion with the vibration member 1. To the outer circumferential portion of the rotor 3, there is attached, through a shock absorber 4, a weight 5 which is fixed by a weight holder 6 through another shock absorber 4. The weight holder 6 has its stem extended in the holes of the shock absorbers 4 and the weight 5, and is fixed to the rotor 3. A pin 7 supports the vibration member 1 and provides a center axis of rotation of the rotor 3 such that it is anchored in a fixture plate 8. Moreover, the plate 8 is formed with a ridge 8*a* spaced at a suitable clearance A from the weight 5. Here, the clearance A has to be larger than a clearance between the weight 5 and the vibration member 1 and has to be made so small that the elastic shock absorbers 4 are compressed to cause an abutment between the weight 5 and the ridge 8*a* when a force weak enough to keep the sliding member 3*a* out of any pressure flaw is applied to the weight 5.

The rotor 3 is forced into contact with the vibration member 1 by a pressure spring 9, a holding seat 10 and a screw 11.

Figure 3A:
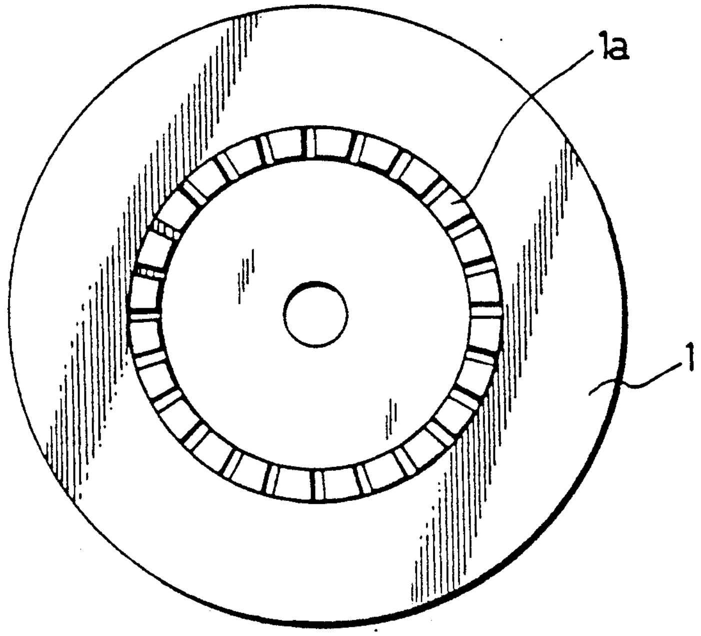
FIG. 3(*a*) is a plane view of a vibration member.
Figure 3B:
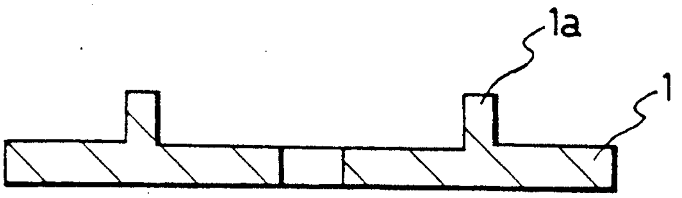

In FIG. 3, the comb-like projections 1*a* are formed at one side of the vibration member 1. The positions of the comb-like projections 1*a* is in the circumferential direction of the one side of the vibration member 1.

As the ultrasonic motor has already been known in the art, its operation will not be described in detail. As known in the art, an electric signal is applied to the piezoelectric element 2 to generate mechanical traveling-waves in the vibration member 1 so that the rotor 3 is rotated. In case no external force or shook is applied in an ordinary status, the clearance A is retained so that the rotor 3 and the weight 5 integrated with the rotor can be rotated to oscillate the entire movement as a result of the movement of the center of gravity, thus informing the wristwatch carrier. In case a strong force or shook is applied to the weight 5 as a result of a fall or the elastic like, the shock absorbers 4 are compressed and absorbed to reduce the clearance A. In the case of a stronger force or shook, the clearance A disappears to bring the weight 5 into abutment against the ridge 8*a*. Since the plate 8 can be conceived here substantially as a rigid member, the external force acting upon the weight 5 can be completely borne. Next will be described in more detail the conditions for the clearance A. Let the status be imagined, in which the weight 5 is brought into abutment against the ridge 8*a* by an acceleration $\alpha$. When the rotor 3 has a mass $M_1$, a force of inertia $F_1$ is expressed by:

$$F_1 = M_1 \alpha \quad (1)$$

In case the shock absorbers 4 and the ridge 8*a* of the plate are omitted, as in the prior art, the inertia force $F_1$ is wholly exerted upon the sliding member 3*a* or the spindle 7.

Since, in the present embodiment, the shock absorbers 4 are compressed to move the weight 5 into abutment against the ridge 8*a* of the plate, the following balance equations hold if the compressive force is designated as $F_2$ and if the reaction of the plate is designated as $F_3$:

$$F_2 = A \cdot K \quad (2)$$

(K: the spring constant of the shock absorbers 4); and $$F_1 = F_2 + F_3 \quad (3).$$

As a result, what is applied to the sliding member 3*a* or the spindle 7 through the shock absorbers is the force $F_2$. If the limit force for preventing the pressure flaw in the sliding member 3*a* or for preventing the spindle 7 from being broken is designated as $f_o$, the following condition is necessary:

$$f_o > f_2 \quad (4).$$

If this inequality is substituted into the Equations (2) and (3), then:

$$f_o > AK.$$

Hence, $$A < f_o/K.$$

If the value of A is so set as to satisfy the following inequality including the condition for preventing the weight 5 from abutting against other parts, the performance of the motor is not troubled in the least:

$$A < f_o/K \quad (5).$$

Figure 4:
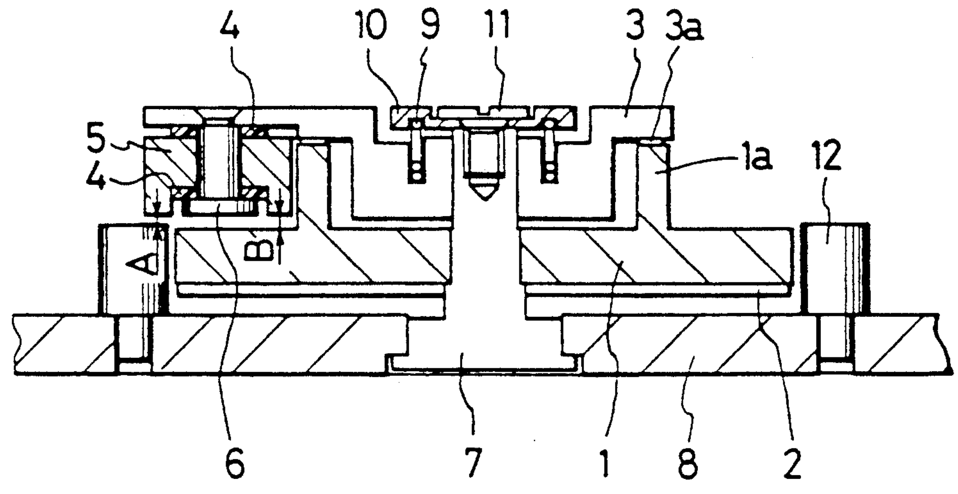
FIG. 4 is a sectional view of a second embodiment of the present invention.
Figure 5:
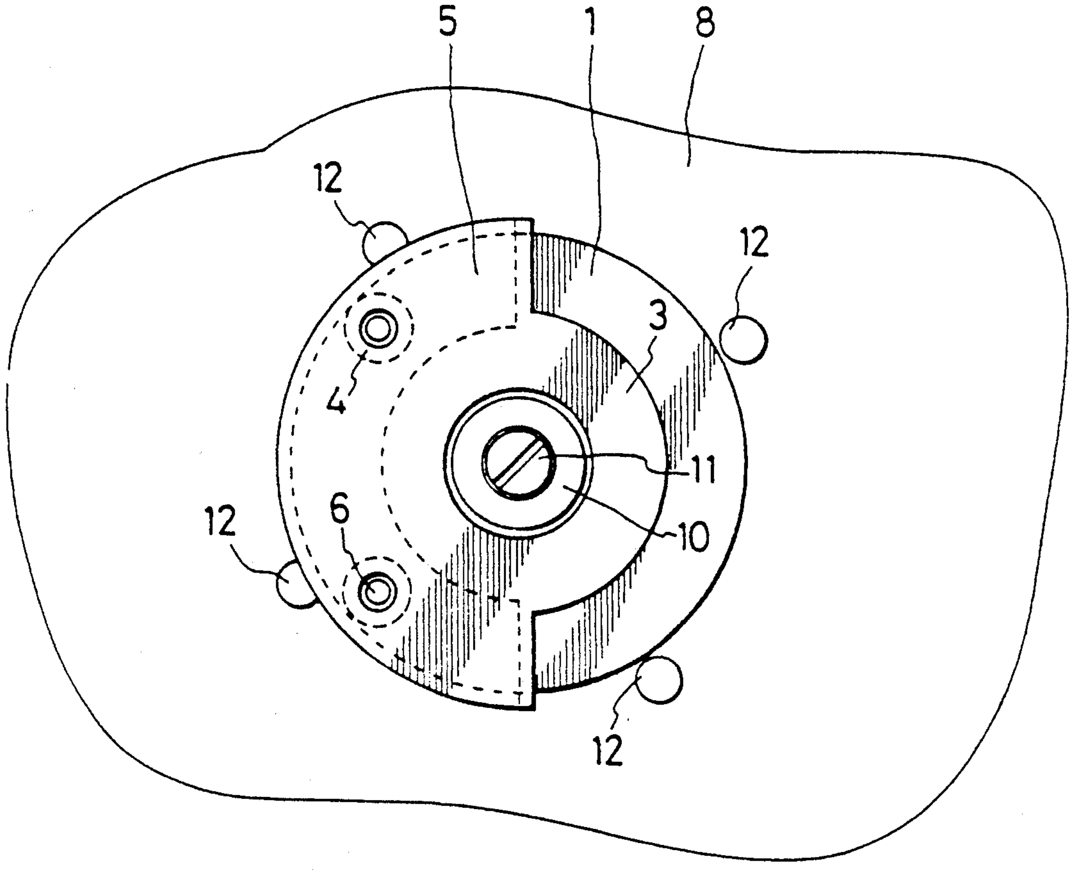
FIG. 5 is a plane view of the second embodiment of the present invention.

FIG. 4 and FIG. 5 show the second embodiment of the present invention. For the abutment of the weight 5, the ridge 8*a* of the plate 8 is replaced by limit pins 12 which are anchored in the plate 8. These plural limit pins 12 are arranged circumferentially along the rotating locus of the weight. In this case, the pressure-flaw preventing effect due to the falling impact or the like is absolutely similar to that of the case of FIGS. 1 and 2. There is no necessity for forming the ridge 8*a* on the plate 8 so that the cutting work of the plate 8 can be simplified to drop the production cost. In addition, although not shown, the limit portion of the weight 5 can be exemplified with an absolutely similar action by not only the limit pins 12 but also the arrangement of rigid parts such as a second plate, a train wheel bridge or a circuit board seat, which is used in an ordinary wristwatch.

Figure 6:
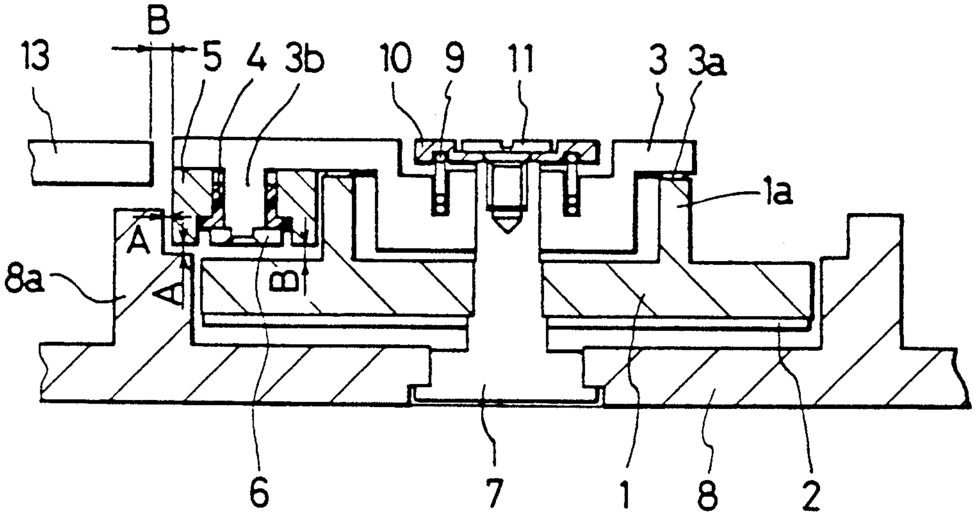
FIG. 6 is a sectional view of a third embodiment of the present invention.
Figure 7:
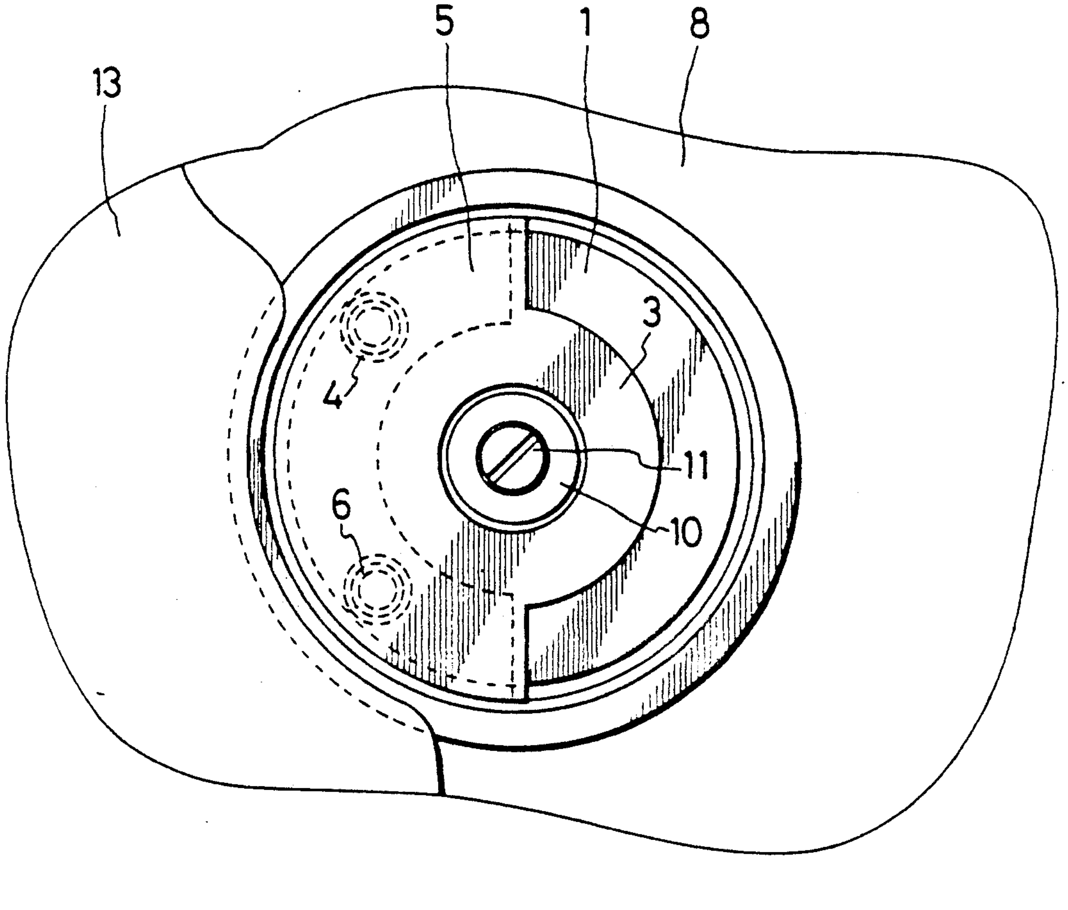
FIG. 7 is a plane view of the third embodiment of the present invention.

FIG. 6 and FIG. 7 show the third embodiment of the present invention.

In FIG. 6 and FIG. 7, a spindle 7 supports the vibration member 1 and provides a center axis of rotation of the rotor 3 such that it is anchored in a plate 8. Moreover, the plate 8 is formed with a two-stepped ridge 8*a* spaced at a suitable clearance A from the lower side of the weight 5 and the outer circumference. Here, the clearance A has to be smaller than a clearance B between the weight 5 and the vibration member 1 in the vertical direction and a clearance B between the weight 5 and another part (such as a circuit board 13) in the horizontal direction.

Hence, the performance of the motor is not troubled in the least:

$$B > A \quad (6)$$

Figure 8:
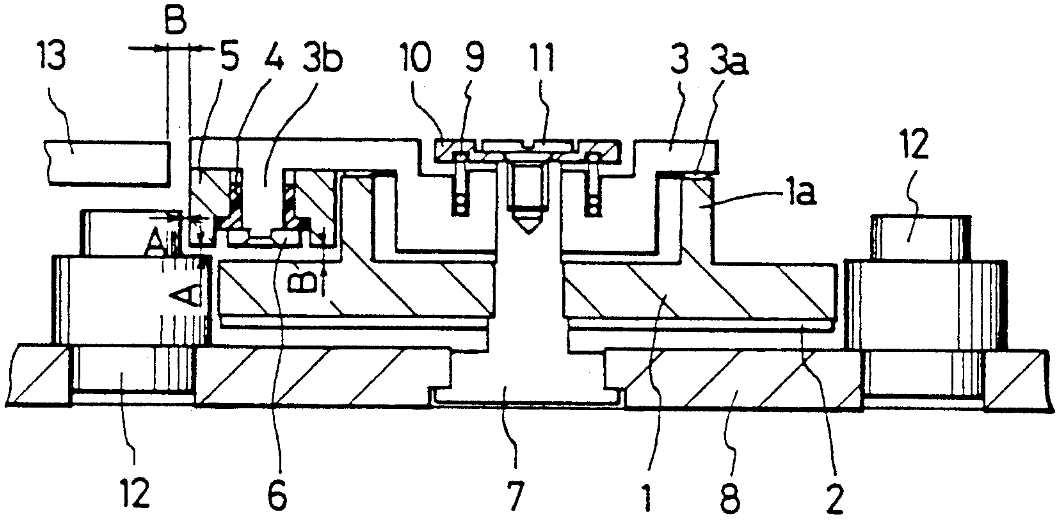
FIG. 8 is a sectional view of a fourth embodiment of the present invention.
Figure 9:
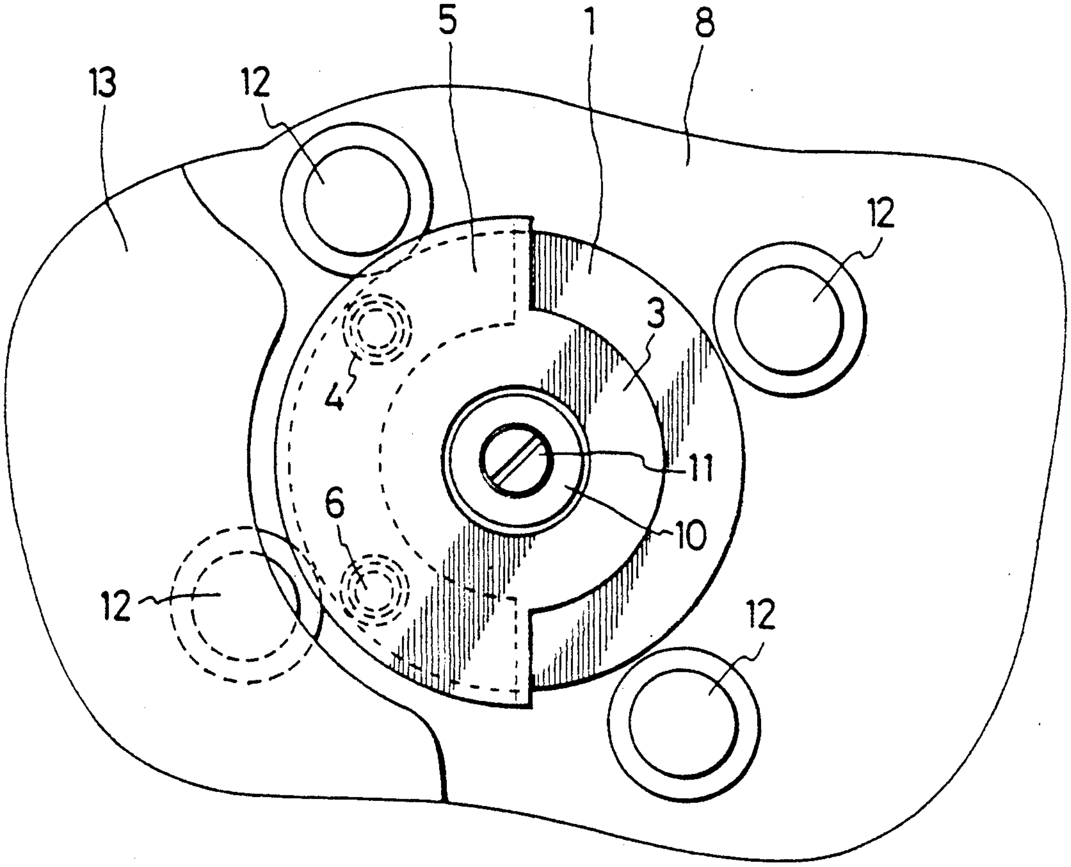
FIG. 9 is a plane view of the fourth embodiment of the present invention.

FIG. 8 and FIG. 9 show the fourth embodiment of the present invention. For the abutment of the weight 5, the ridge 8*a* of the plate 8 is replaced by limit pins 12 which are anchored in the plate 8. These plural limit pins 12 are arranged circumferentially along the rotating locus of the weight. In this case, the pressure-flaw preventing effect due to the falling impact or the like is absolutely similar to that of the case of FIG. 1 and FIG. 2. There is no necessity for forming the ridge 8*a* on the plate 8 so that the cutting work of the plate 8 can be simplified to drop the production cost. In addition, although not shown, the limit portion of the weight 5 can be exemplified with an absolutely similar action by not only the limit pins 12 but also the arrangement of rigid parts such as a second plate, a train wheel bridge or a circuit board seat, which is used in an ordinary wristwatch.

Figure 10:
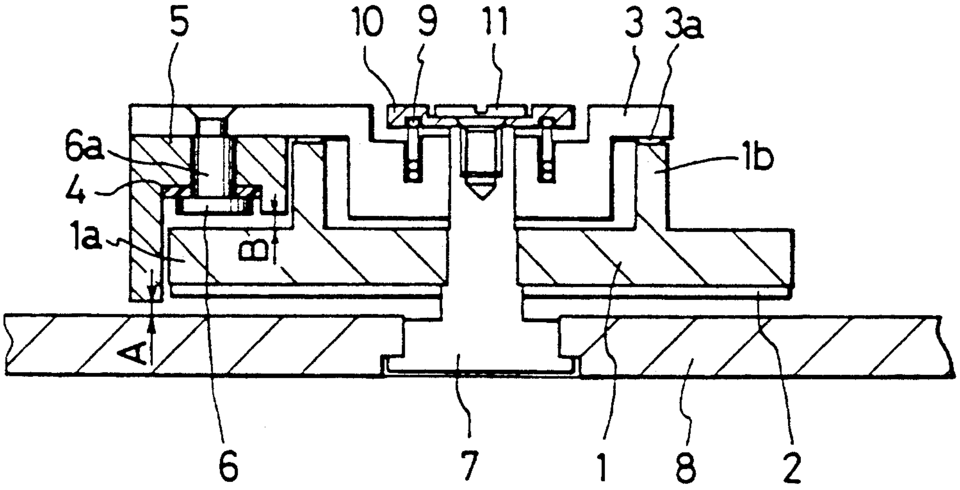
FIG. 10 is a sectional view of a fifth embodiment of the present invention.
Figure 11:
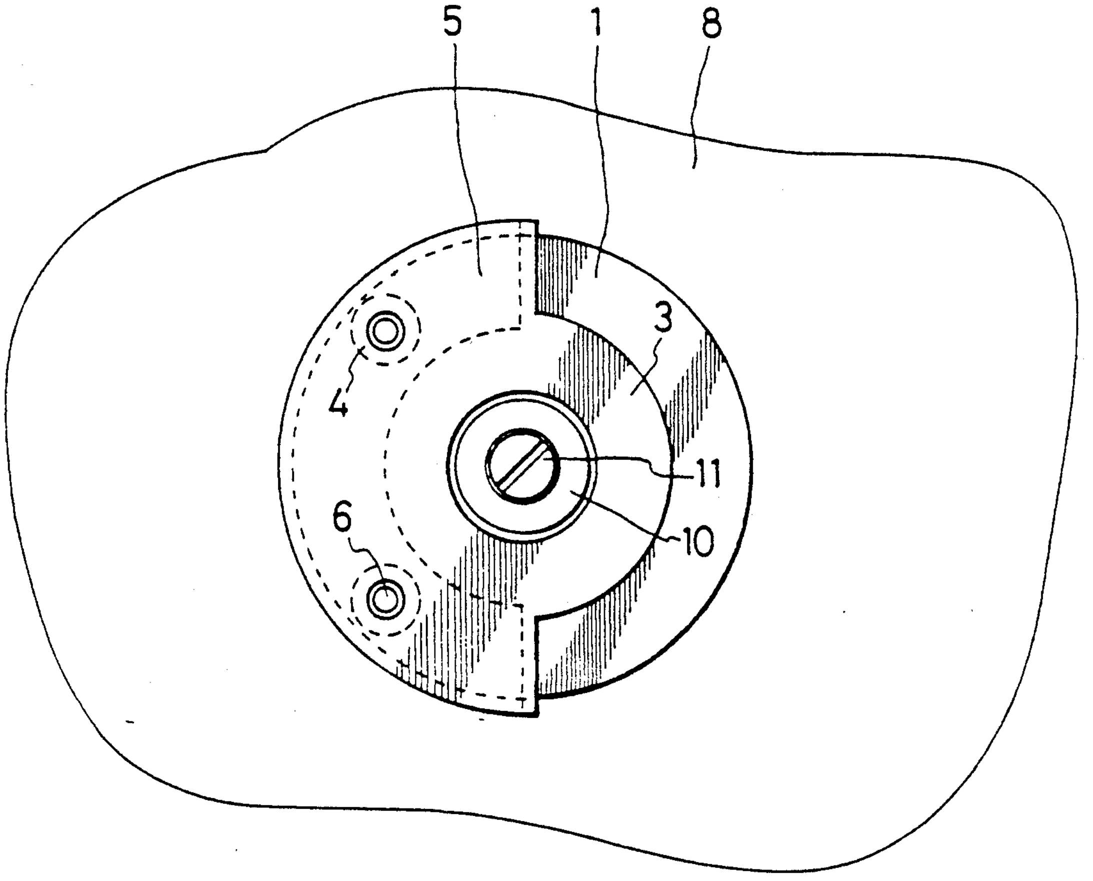
FIG. 11 is a plane view of the fifth embodiment of the present invention.

FIG. 10 and FIG. 11 show the fifth embodiment of the present invention.

The weight 5 is arranged in a semi-arcuate shape at the outside of the comb-like projections 1*b* of the vibration member 1 and has a thickness to form a clearance B from the upper face of the base 1*a* of the vibration member 1 at the diametrical inside of the base 1*a* and a thickness to protrude from the lower face of the base 1*a* at the diametrical outside of the base 1*a* thereby to retain a clearance A from the plate 8. Here, the clearance A has to be larger than the clearance B between the weight 5 and the vibration member 1 and has to be made so small that the shock absorbers 4 are compressed to cause an abutment between the weight 5 and the plate 8 when a force weak enough to keep the sliding member 3*a* out of any pressure flaw is applied to the weight 5.

If the clearance A is thus set to satisfy the Equation (5) and (6), no pressure flaw is formed in the sliding member 3*a* so that no trouble is caused in the performance of the ultrasonic motor. If the frequency V of the oscillations is then quantitatively expressed, it is expressed by the following Equation if the weight 5 has a primary moment I and a rotating angular velocity $\omega$:

$$V = C \cdot I\omega^2$$

Here, under the condition in which the impact of the weight is received by the plate 8, as has been described hereinbefore, it is the shape to maximize the primary moment if the weight 5 is protruded downward to the vicinity of the plate 8 at the outside of the vibration member 1. As a result, the maximum oscillations can be generated in the limited space.

As has been described hereinbefore, according to the present invention, the weight portion for oscillating the wristwatch with the oscillation alarm using the ultrasonic motor is separated from the rotor and attached through the shock absorbers, and the limit portion is disposed in the vicinity of the weight. Thus, there can be attained an effect that deterioration of the motor performance can be prevented by the falling impact or the like.

Figure 12:
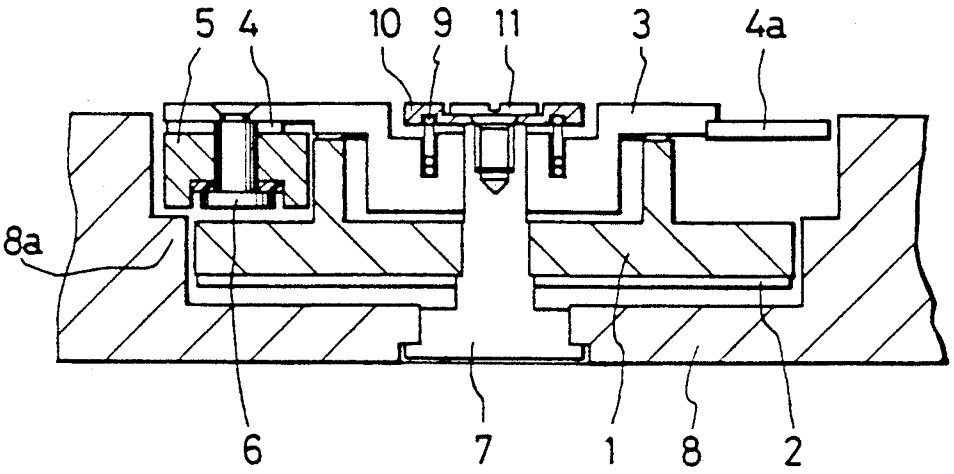
FIG. 12 is a sectional view of a sixth embodiment of the present invention.
Figure 13:
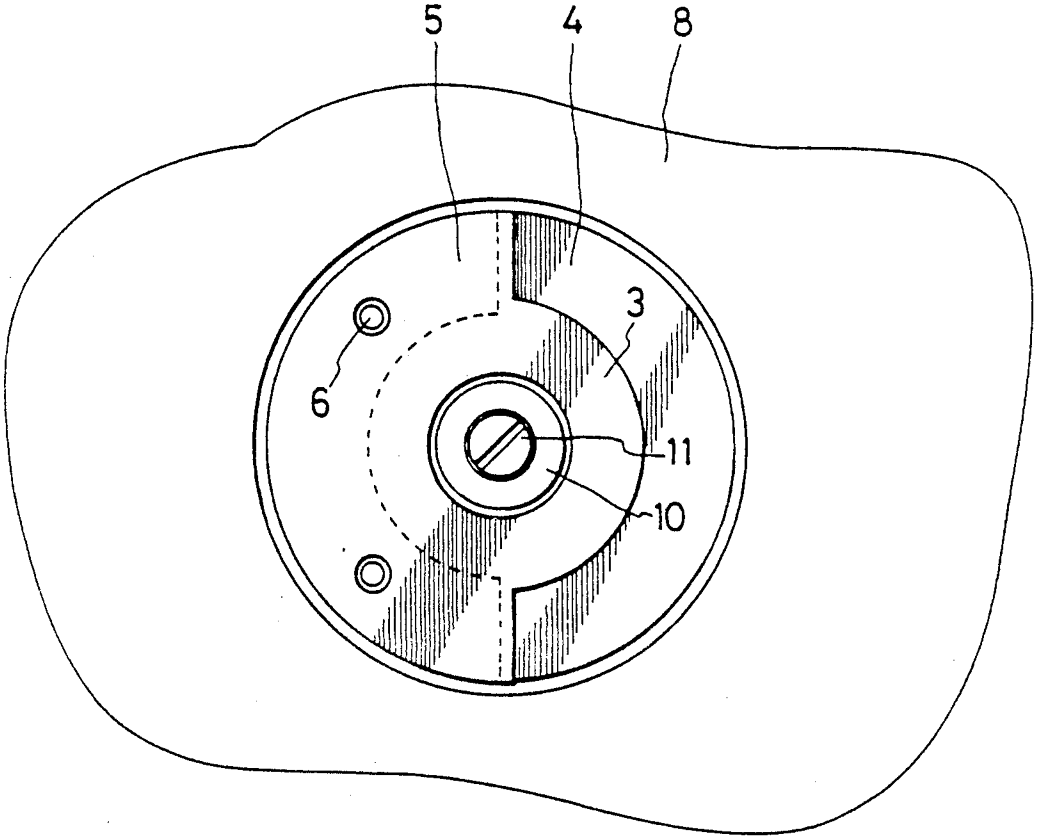
FIG. 13 is a plane view of the sixth embodiment of the present invention.

FIG. 12 and FIG. 13 show the sixth embodiment of the present invention.

Since the weight 4 is formed into a sector shape of $\frac{1}{2}$ to $\frac{2}{3}$ so as to have an eccentric center of gravity, a gap is established between the vibration member 1, the rotor 3 and the weight 5 and by the fixture plate 8.

The shock absorber 4 is formed with an extension 4*a* for covering the side gap. Since the side gap can be covered with the extension 4*a* of the aforementioned shock absorber 4, no dust or the like invades into said side gap so that the oscillation motor can be prevented from being stopped by dust or the like to thereby improve the reliability.

Figure 14:
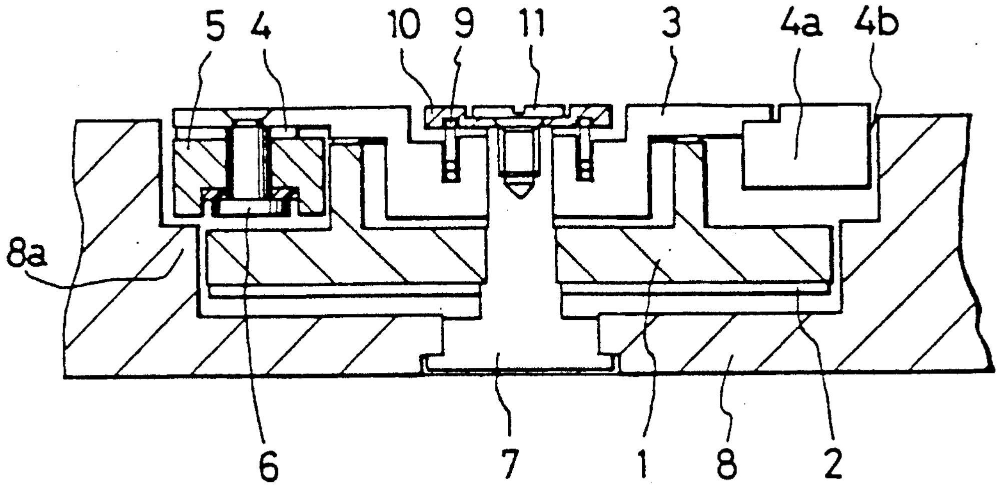
FIG. 14 is a sectional view of a seventh embodiment of the present invention.
Figure 15:
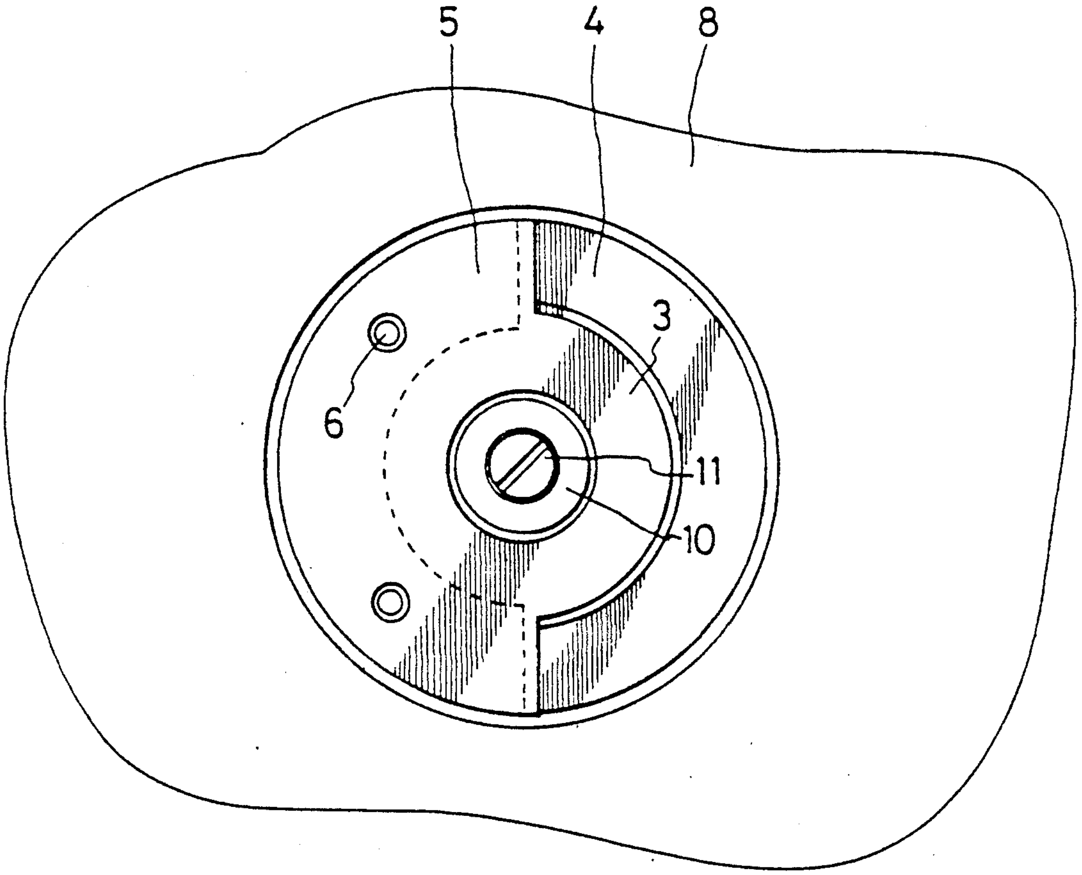
FIG. 15 is a plane view of the seventh embodiment of the present invention.

As shown in FIG. 14 and FIG. 15, moreover, the shock absorber 4 is formed with the extension 4*a* and a side portion 4*b* to occupy the side gap to make it more difficult for the dust or the like to invade into the side gap. As a result, it is possible to provide a structure for improving the reliability of the oscillation motor.

Thanks to the absence of the side gap, moreover, the air resistance acting upon the transverse section of the weight 5 is not received from the side gap, thus raising an advantage that the performance of the oscillation motor is improved.

Figure 16:
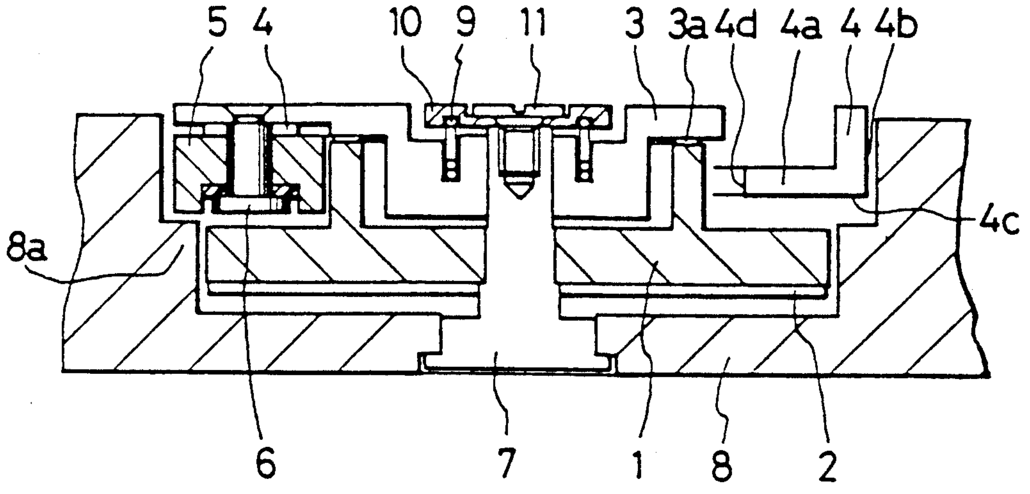
FIG. 16 is a sectional view of the eighth embodiment of the present invention.
Figure 17:
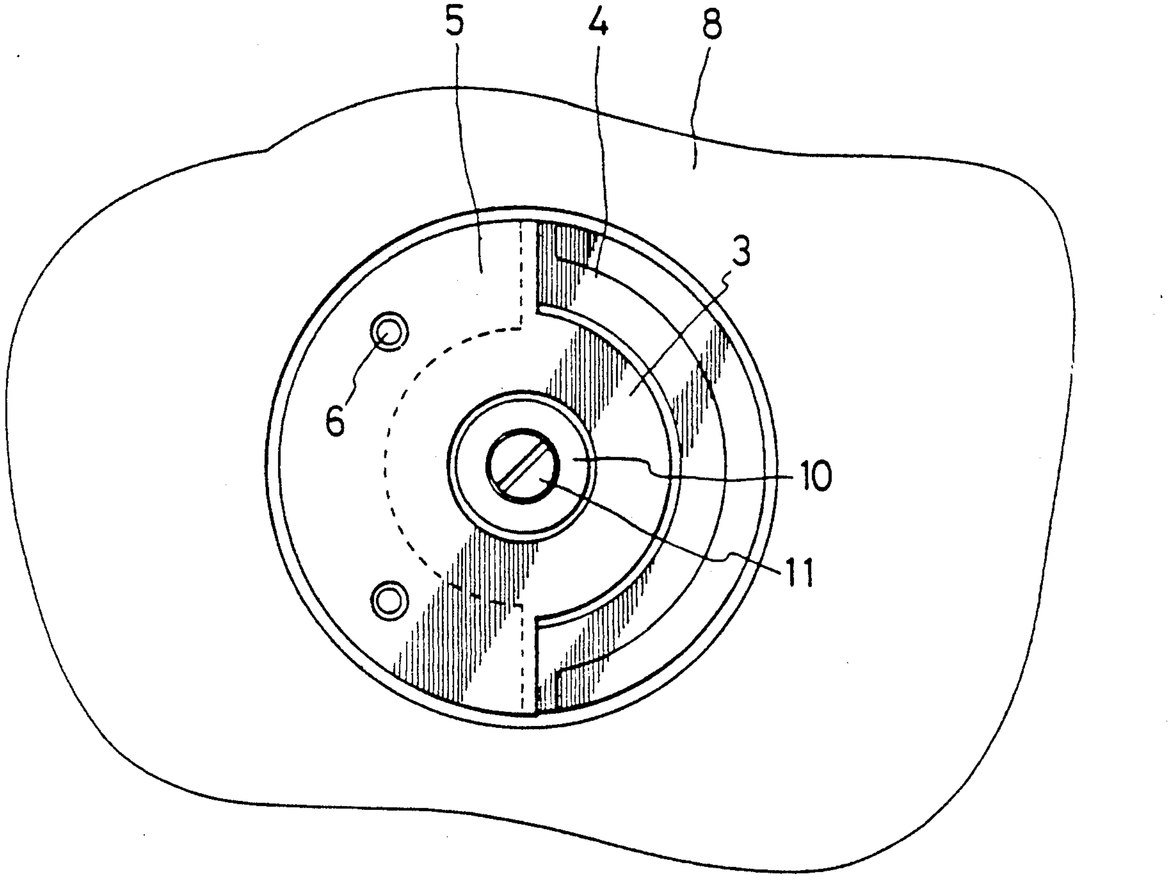
FIG. 17 is a plane view of the eighth embodiment of the present invention.

In FIG. 16 and FIG. 17, the shock absorber 4 is formed with the side portion 4*b* and an extension 4*c* in the vicinity of the vibration member 1 and at its central portion with an aperture 4*d*. Since the pressure contact between the comb-like projections 1*b* of the oscillator 1 and the sliding member 3*b* of the rotor 3 can thus be confirmed, the spring force of the pressure spring 9 can be easily adjusted to reduce the dispersion in the performance of the oscillation motor while preventing the invasion of dust or the like.

Figure 18:
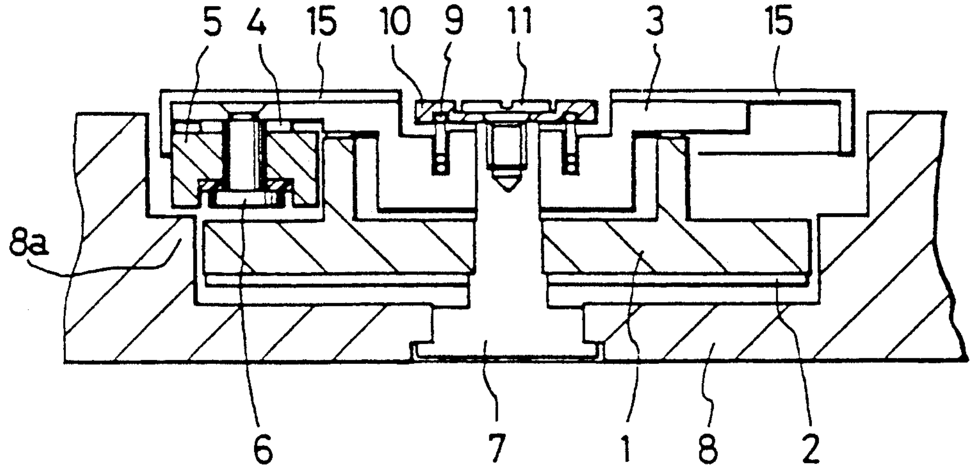
FIG. 18 is a sectional view of a nineth embodiment of the present invention.
Figure 19:
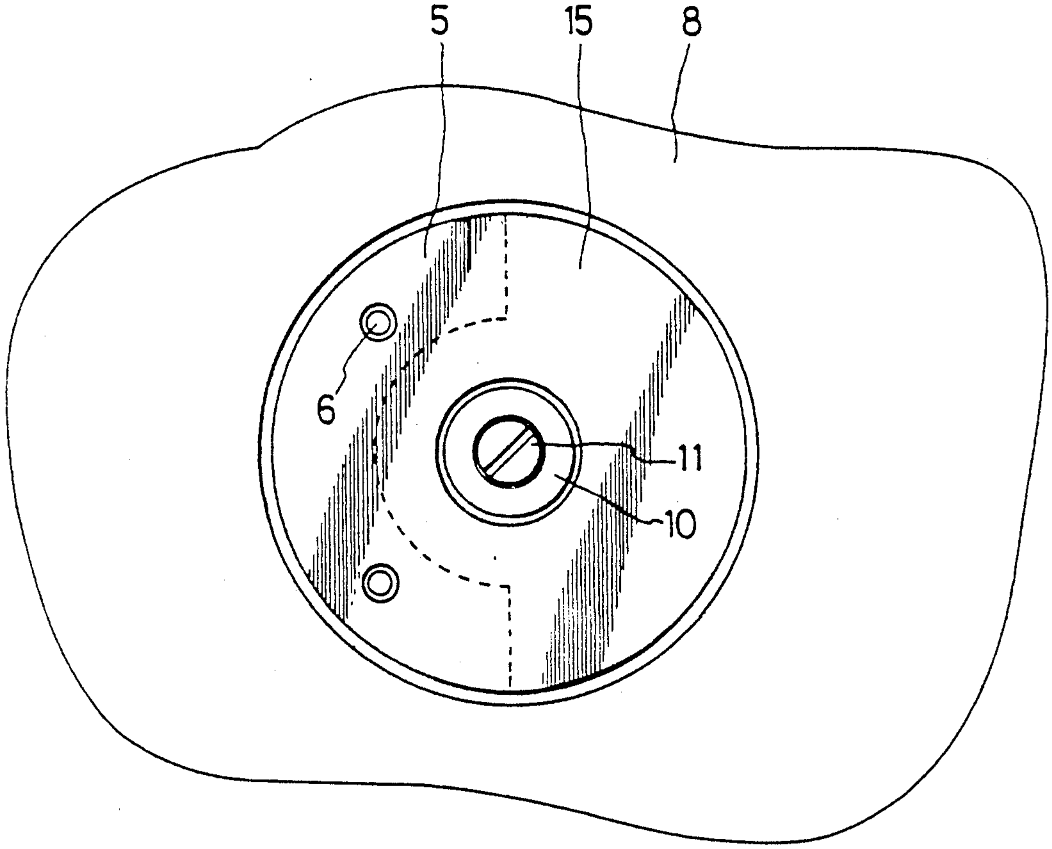
FIG. 19 is a plane view of the nineth embodiment of the present invention.

In FIG. 18 and FIG. 19 moreover, there is provided a dustproof member 15 which is constructed of the vibration member 1, the rotor 3 and the weight 5 for covering the oscillation motor and the gap which is formed between the vibration member 1, the rotor 3 and the weight 5 and the plate 8. Thus, it is possible to provide a reliable oscillation motor which effectirely prevents the invasion of dust or the like. If the dust-proof member 15 has its top face printed or engraved, there can be attained another advantage that a decorative oscillation motor can be provided.

In the embodiments as described from FIG. 12 to FIG. 19, the oscillation motor structure for an electronic wristwatch with a soundless alarm can be provided such that the shock absorber 4 or the dust-proof member 15 is formed to cover the side gap which is defined by the vibration member 1, the rotor 3 and the weight 5 and by the plate 8.

As has been described hereinbefore, the present invention adopts the shock absorber or the dust-proof member, which is formed to cover the gap defined by the vibration member, the rotor and the weight and by the plate. Thanks to this adoption, the present invention has many effects including that impaired operation due to the invasion of dust or the like as in the prior art can be prevented to improve the reliability and the performance, and that it is possible to provide an electronic wristwatch having a soundless alarm and a beautiful appearance.

Figure 20:
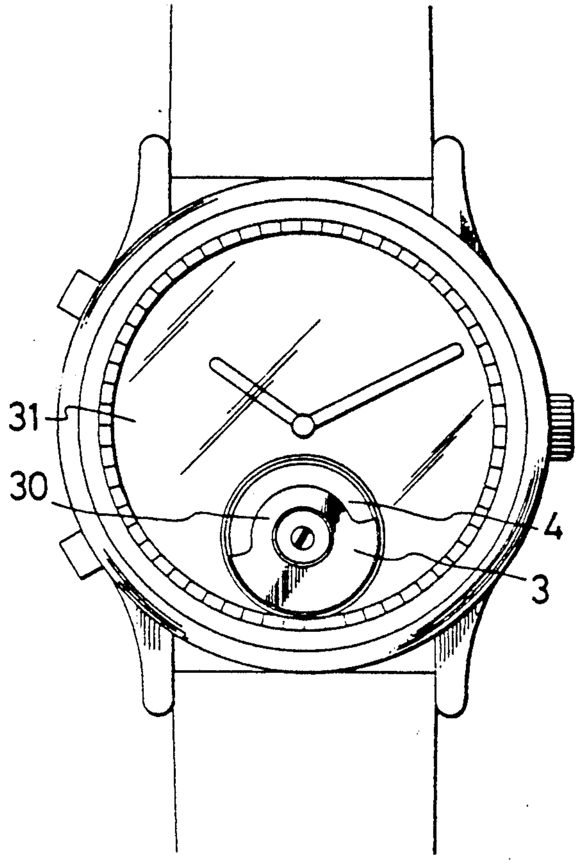
FIG. 20 is a plane view of a wristwatch with oscillation alarm.
Figure 21:
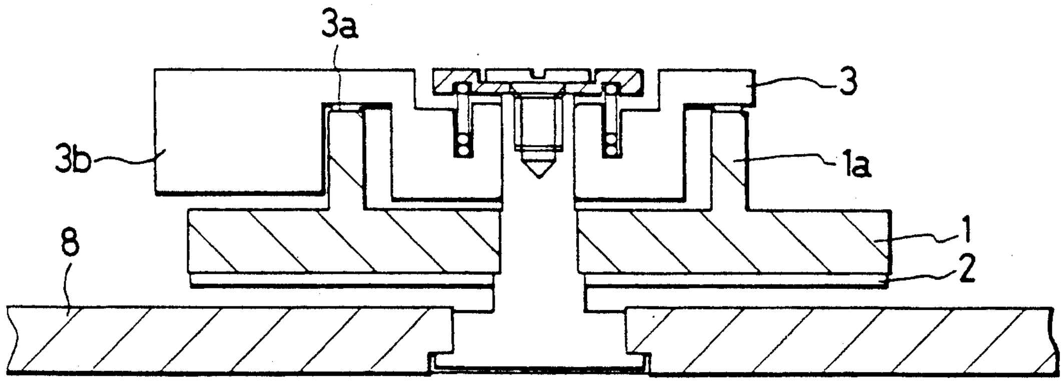
FIG. 21 PRIOR ART
FIG. 21 is a sectional view of an example of the prior art.

FIG. 20 shows a wristwatch with a soundless oscillation alarm.

An ultrasonic motor 30 is disposed in an opening of the dial 31. Accordingly, the performance of the rotation of the ultrasonic motor can be observed from the dial side of the watch.

What is claimed is:

1. A wristwatch with an oscillation alarm using an ultrasonic motor as a drive source of an oscillation motor and comprising:

- a vibration member having a piezoelectric element adhered to its one side and comb-like projections to its other side;
- a rotor having a sliding member disposed on said comb-like projections of said vibration member;
- a pressure-regulator for generating suitable contact pressure between said rotor and said vibration member;
- fixture means for fixing said oscillation motor;
- a weight connected to said rotor and having a center of gravity eccentrically of the center of said rotor;
- a first shock absorber sandwiched between said weight and said rotor;
- a weight holder for holding said weight to said rotor;
- a second shock absorber sandwiched between said weight and said weight holder; and
- a rigid member disposed at the side of said weight holder.

2. A wristwatch with an oscillation alarm as claimed in claim 1; wherein said rigid member is arranged in the vicinity of said weight.

3. A wristwatch with an oscillation alarm as claimed in claim 1; wherein said rigid member is arranged in the outer circumference of said weight.

4. A wristwatch with an oscillation alarm as claimed in claim 1; wherein said weight has a thickness sufficient to project from the lower face of said vibration member.

5. A wristwatch with an oscillation alarm as claimed in claim 1; wherein said first shock absorber is configured to cover the gap between said rotor, said weight and said fixture means.

6. A wristwatch with an oscillation alarm as claimed in claim 1; further comprising a dust-proof member mounted on said oscillation motor.

7. A wristwatch with an oscillation alarm as claimed in claim 1; wherein said oscillation motor is disposed in an opening of a dial to enable rotation of said rotor to be observed.

8. An oscillation alarm device for a wristwatch, comprising: a vibration member; support means for supporting the vibration member; a rotor in frictional contact with the vibration member and mounted to rotate about an axis of rotation; means for creating flexural vibrations in the vibration member effective to rotationally drive the rotor; a weight connected to the rotor to undergo rotation therewith, the weight having a center gravity offset from the axis of rotation of the rotor so that rotation of the rotor and weight produces mechanical oscillation of the support means; and shock absorbing means carried by the rotor for absorbing shocks applied to the rotor to thereby prevent damage to the rotor.

9. An oscillation alarm device according to claim 8; including stationary abutting means spaced from the weight for abutting therewith when shocks of sufficient magnitude are applied to the rotor to cause displacement of the weight into abutment with the abutting means.

10. An oscillation alarm device according to claim 9; wherein the abutting means comprises projections connected to the support means and projecting outwardly therefrom, the projections being spaced from the underside of the weight to abut therewith when shocks of sufficient magnitude are applied to the rotor.

11. An oscillation alarm device according to claim 10; wherein the projections comprise pins inserted in openings in the support means.

12. An oscillation alarm device according to claim 11; wherein the pins have a stepped configuration to enable the pins to abut with both the underside and the side periphery of the weight.

13. An oscillation alarm device according to claim 9; wherein the abutting means comprises a ridge portion of the support means, the ridge portion being spaced from the underside of the weight to abut therewith when shocks of sufficient magnitude are applied to the rotor.

14. An oscillation alarm device according to claim 13; wherein the ridge portion has a stepped configuration to enable the ridge portion to abut with both the underside and the side periphery of the weight.

15. An oscillation alarm device according to claim 8; wherein the shock absorbing means comprises elastic shock absorbers.

16. An oscillation alarm device according to claim 8; including holding means for holding the weight on the rotor, the shock absorbing means being interposed between the weight and at least one of the holding means and the rotor.

17. An oscillation alarm device according to claim 16; wherein the shock absorbing means is interposed between the weight and the holding means.

18. An oscillation alarm device according to claim 16; wherein the shock absorbing means is interposed between the weight and both the holding means and the rotor.

19. An oscillation alarm device according to claim 8; including in combination therewith a wristwatch having means for indicating time, the oscillation alarm device being mounted in the wristwatch.

20. The combination according to claim 19; wherein the wristwatch has a dial having an opening therein, the oscillation alarm device being positioned within the wristwatch such that the rotation of the rotor is visible through the dial opening.

* * * * *